(12) United States Patent
Glocker

(10) Patent No.: US 6,224,725 B1
(45) Date of Patent: May 1, 2001

(54) UNBALANCED MAGNETRON SPUTTERING WITH AUXILIARY CATHODE

(75) Inventor: David A. Glocker, Rush, NY (US)

(73) Assignee: Isoflux, Inc., Rush, NY (US)

( * ) Notice: Subject to any disclaimer, the term of this patent is extended or adjusted under 35 U.S.C. 154(b) by 0 days.

(21) Appl. No.: 09/496,875

(22) Filed: Feb. 2, 2000

Related U.S. Application Data

(60) Provisional application No. 60/119,263, filed on Feb. 9, 1999.

(51) Int. Cl.$^7$ .................................................. C23C 14/35
(52) U.S. Cl. .............................. 204/298.19; 204/298.06; 204/298.18; 204/298.26; 204/298.14; 204/298.17; 204/192.12
(58) Field of Search .................. 204/298.19, 298.06, 204/298.18, 298.26, 298.14, 298.17, 192.12

(56) References Cited

U.S. PATENT DOCUMENTS

| 4,572,776 | * | 2/1986 | Aichert et al. | 204/298.19 |
| 5,556,519 | * | 9/1996 | Teer | 204/192.12 |
| 5,948,224 | * | 9/1999 | Signer et al. | 204/298.08 |

* cited by examiner

Primary Examiner—Mark F. Huff
Assistant Examiner—Daborah Chacko-Davis
(74) Attorney, Agent, or Firm—Harris Beach LLP

(57) ABSTRACT

An improved unbalanced magnetron sputtering (UMS) apparatus in accordance with the invention having a conventional target and arrangement of magnets wherein a central portion of the target is backed by a first magnetic pole and the peripheral portion of the target is backed by a second magnetic pole, the poles carrying unequal numbers of lines of magnetic flux. One of the poles has a greater number of flux lines entering or leaving than does the other pole. The field lines extending from the higher flux pole which do not close in the lower flux pole extend into space in a range of directions and generally toward a substrate to be sputter coated. Adjacent the target and electrically isolated therefrom and overlying the higher flux pole is an independently-controllable auxiliary electrode, preferably a cathode, formed of a non-ferromagnetic material and having a surface facing in the same general direction as the sputterable surface of the target. Electrons emitted from the auxiliary electrode are controlled at an energy level optimal for ionization of the working gas. These electrons are not constrained near the surface of the cathode but instead may migrate freely along the field lines toward the substrate, resulting in increased plasma density throughout the coating range, especially in the vicinity of the substrate, and biasing an insulated substrate at a potential related to the potential of the secondary cathode. A plurality of UMS devices having auxiliary cathodes may be grouped in concert to produce a coating range plasma trap.

14 Claims, 7 Drawing Sheets

UNBALANCED MAGNETRON SPUTTERING WITH AUXILIARY CATHODE

This application claims benefit of U.S. Provisional Application 60/119,263 filed Feb. 9, 1999.

DESCRIPTION

The present invention relates to apparatus for magnetron sputtering, more particularly to apparatus for unbalanced magnetron sputtering, and most particularly to apparatus for enhancing the plasma density in a magnetron sputtering apparatus by independent control of the number and energy of plasma-forming electrons.

The term "unbalanced magnetron sputtering" (UMS) refers in the art to magnetron sputtering wherein the flux densities in north and south poles of a magnetron are unequal, resulting in some lines of magnetic force closing at infinity. These lines are referred to herein as "unclosed" or "open" lines. Because ionizing electrons follow a spiral path around magnetic lines of force, unclosed lines can provide a convenient pathway for guiding electrons away from the region of plasma immediately adjacent to the sputtering target and toward the substrate, thereby increasing the plasma volume and density in the vicinity of the growing depositional film. This can be beneficial in applications wherein a large or irregular object is the substrate to be coated with hard and corrosion-resistant materials, and particularly where the substrate is negatively biased to accelerate ions toward the growing film. Such bias can improve the quality of sputtered thin-films by improving density, composition, and microstructure. Therefore, the highest possible ionization density is desirable.

The principles of UMS are disclosed in a pair of publications by Window and Savvides in the Journal of Vacuum Science and Technology, A4(2), March/April 1986, and A4(3), May/June 1986. Structure and operation of a single unbalanced magnetron is described.

A "coating range" within which a substrate may be coated may be established by the magnetic coupling of two or more opposed UMS devices, as disclosed in U.S. Pat. No. 5,196,105 issued Mar. 23, 1993 to Feuerstein et al. Magnetic field lines which do not close within one UMS device may close with corresponding lines of another UMS device to form a magnetic boundary to electrons and ions within the coating range between the devices. The coating range can be bounded further by an independent magnetic field provided by an additional magnet or magnets disposed outboard of the sputtering target or targets of the UMS devices such that poles of opposite polarity are opposite one another on both sides of the coating range. This arrangement provides a "cage" of magnetic flux lines for retaining electrons and plasma in the coating range between the UMS devices. The coating range can be further broadened to accommodate large or irregular substrates by addition of another pair of UMS devices disposed orthogonally to the first pair. Other similar configurations are possible, as disclosed in U.S. Pat. No. 5,556,519 issued Sept. 17, 1996 to Teer.

A limitation of pure magnetron sputtering is that deposition of sputtered material on a substrate is substantially ballistic between the target and the substrate and thus is limited in deposition energy to the kinetic energy of the target atoms being sputtered. It is known that improved coatings can be achieved through negative electrical biasing of the substrate to make it more attractive to bombardment by ions. For example, the coating of opposite or multiple surfaces of a substrate using parallel opposed magnetron devices on opposite sides of a substrate can be improved by providing controlled-voltage anodes outboard of the targets for accelerating low-energy electrons which escape the plasma, as disclosed in U.S. Pat. No. 4,871,434 issued Oct. 3, 1989 to Münz et al., which energizes electrons to form further ions by collision with working gas atoms. The resulting increased ion density at the substrate permits reduction of the substrate bias voltage without reduction in the bias current. In this arrangement, however, there is no lateral constraint of the plasma other than the physical boundaries of the coating chamber.

A further problem, common to all magnetron sputtering schemes whether balanced or unbalanced, is that a field potential of typically 500 V or greater is necessary across the electric sheath overlying the target surface to provide sufficient acceleration of argon ions to cause sputter displacement of target atoms. The sheath also accelerates secondary electrons emitted from the target into the plasma. The collision of these accelerated electrons with argon atoms sustains the plasma sputtering reaction. However, electrons of 500 eV energy are relatively inefficient at ionization of argon atoms. The optimum energy for such electrons is known to be in the range of 50 eV to 100 eV. Therefore, in the known art, the energy needs for argon ion acceleration run counter to the energy needs for high-efficiency plasma formation.

Further, in the known art, the plasma is formed in the magnetron magnetic field in the vicinity of the target and extends to the deposition substrate only by diffusion.

Thus, there is a need for magnetron sputtering means whereby electrons may be generated, magnetically guided, and accelerated into the working gas at energies optimal for the ionization thereof, independent of the voltage across the electric sheath, and there is a further need for means whereby electrons may be accelerated toward the substrate to form a plasma in the vicinity thereof to intensify ion-bombardment of the substrate coincident with sputter deposition of target material.

It is a principal object of the invention to provide an improved apparatus for unbalanced magnetron sputtering wherein electrons for ionizing the working gas are provided independently of and in addition to electrons emitted from the target surface.

It is a further object of the invention to provide an improved apparatus for unbalanced magnetron sputtering wherein auxiliary electrons are provided at an energy level substantially optimal for ionization of the working gas which thereby increase the plasma density.

It is a still further object of the invention to provide an improved apparatus for unbalanced magnetron sputtering wherein both the number and the energy of auxiliary electrons may be independently controlled to control the density of the plasma.

It is a still further object of the invention to provide an improved apparatus for unbalanced magnetron sputtering wherein an insulating substrate is biased inherently and without resort to conventional radio frequency power supplies and controls.

Briefly described, an improved unbalanced magnetron sputtering apparatus in accordance with the invention has a conventional target which may be circular and planar. Adjacent the non-sputtered side of the target is a conventional arrangement of magnets wherein a central portion of the target is backed by a first magnetic pole, for example, south, and the peripheral portion of the target is backed by a second magnetic pole, for example, north. The respective poles are sized in cross-section or strength such that the flux passing through the central pole differs from (is greater or less than) the flux passing through the peripheral pole. The polepieces are connected across their distal extremities, thus creating conventionally a magnetic field in space above the surface of the target, which field at its extreme is parallel to that surface. Energizable primary cathodes are provided conventionally adjacent to the magnets to generate an electric sheath along the target surface. Because the polepieces are appropriately sized or of appropriate field strength, additional field lines extend from one polepiece which cannot close in the other polepiece but rather extend into space in a range of directions and generally toward a substrate to be coated. In a presently preferred embodiment, the central polepiece has fewer lines of magnetic flux passing through it.

Outboard of the target and electrically isolated therefrom is an independently-controllable secondary electrode, preferably a cathode, formed of a non-ferromagnetic material and having a surface facing in the same general direction as the sputterable surface of the target. The peripheral magnet polepiece is formed to extend beyond the edge of the target to back the secondary electrode as well. In operation, non-closed magnetic field lines extend from the peripheral polepiece through the auxiliary electrode toward the substrate. Electrons are emitted from the auxiliary electrode at a controlled energy level optimal for ionization of the working gas. These electrons are not constrained near the surface of the electrode but instead may migrate freely along the magnetic field lines toward the substrate, resulting in increased plasma density throughout the coating range and biasing the substrate, if suitably insulated, at a potential related to the potential of the secondary cathode.

In a further embodiment in accordance with the invention, a plurality of UMS devices having auxiliary electrodes may be grouped in concert to produce a coating range plasma trap.

The foregoing and other objects, features, and advantages of the invention, as well as presently preferred embodiments thereof, will become more apparent from a reading of the following description in connection with the accompanying drawings in which.

Figure 1:
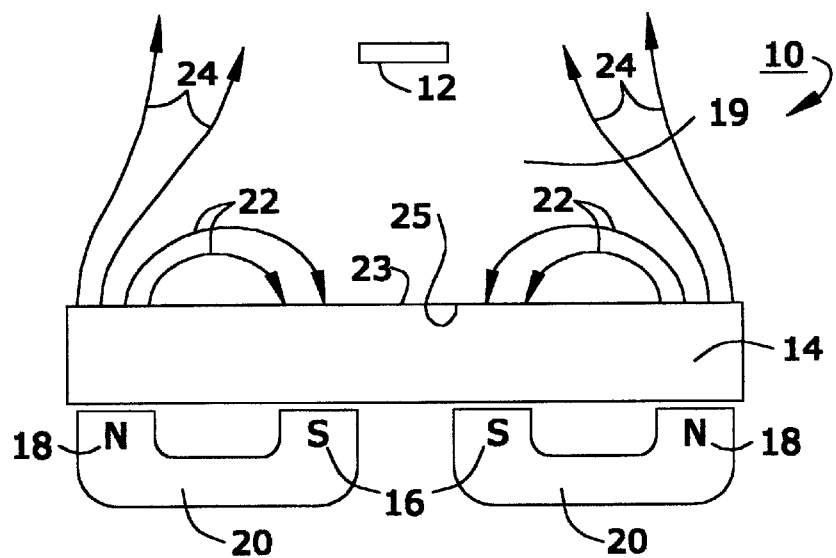
FIG. 1 is a schematic cross-sectional view of a first embodiment of an unbalanced magnetron in accordance with the prior art, wherein the inner magnetic polepiece has fewer lines of magnetic flux passing through it than does the outer magnetic polepiece.

Referring to FIG. 1, a prior art unbalanced magnetron apparatus 10 for sputter deposition of material onto a substrate 12 comprises a target 14, an inner magnetic polepiece 16, an outer magnetic polepiece 18, and a magnetic shunt 20 connecting polepieces 16 and 18. Typically, such a magnetron is circular, rectangular, or elliptical in plan view, the polepieces being geometrically closed structures, for example, toroids or ellipses, such that what appear to be separate left and right poles 16,18 as shown in FIG. 1 are actually single continuous poles. For simplicity in presentation, other conventional apparatus elements essential to any actual sputtering assembly, including sputtering electrodes, gas distribution means, vacuum pumps, a housing, and the like, are not shown but will be readily inferred by a reader of ordinary skill in the art. The magnets formed by the combination of polepieces 16 and 18 and shunt 20 may be permanent magnets or electromagnets, as is known in the art. In operation, a magnetron exhibits a plasma 19 consisting of ionized atoms of a working gas, typically argon, formed by atomic collisions of gas atoms with energized electrons in the vicinity of field lines 22, and a "sheath" 23 consisting of thin, high-gradient electric and magnetic fields along the surface 25 of target 14.

Figure 2:
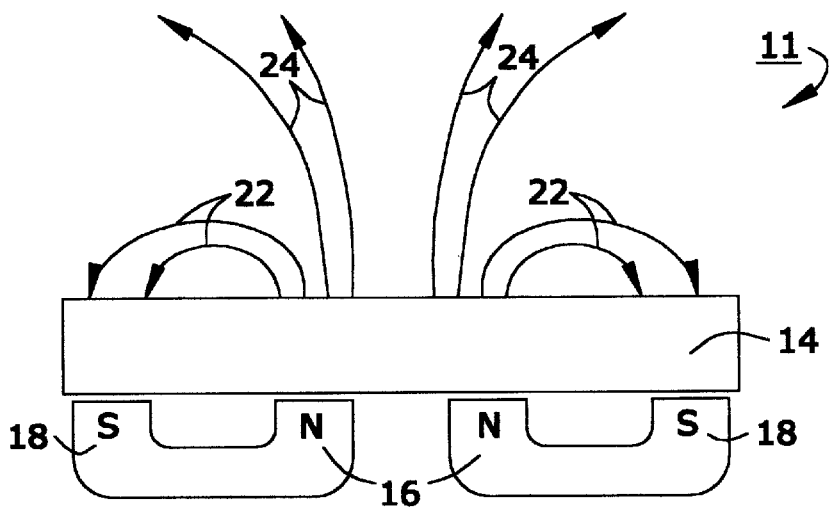
FIG. 2 is a schematic cross-sectional view of a second embodiment of an unbalanced magnetron in accordance with the prior art, wherein the outer magnetic polepiece has fewer lines of magnetic flux passing through it than does the inner magnetic polepiece.

In FIG. 1, the inner pole is labelled as "south" and the outer pole as "north." This is purely arbitrary, and the opposite polarity functions equally well. What is of paramount importance, however, is that more magnetic field lines 22 pass through polepiece 18 than through polepiece 16. Thus, all magnetic field lines 22 between poles 16 and 18 are closed, whereas additional lines 24 extend from outer polepiece 18 but are not closed into polepiece 16 and rather are "open" and extend in a direction generally away from apparatus 10 to "close" at infinity. FIG. 2 shows the field line relationships for an otherwise identical magnetron 11 wherein the outer polepiece has fewer flux lines than the inner polepiece.

Flux through the polepieces may be controlled simply by properly selecting the cross-sectional area of the polepieces. Alternatively, the polepieces may be made from materials having different magnetic coercivities, or electromagnets may be combined with permanent magnets as is known in the art to induce a non-closed field.

Figure 3:
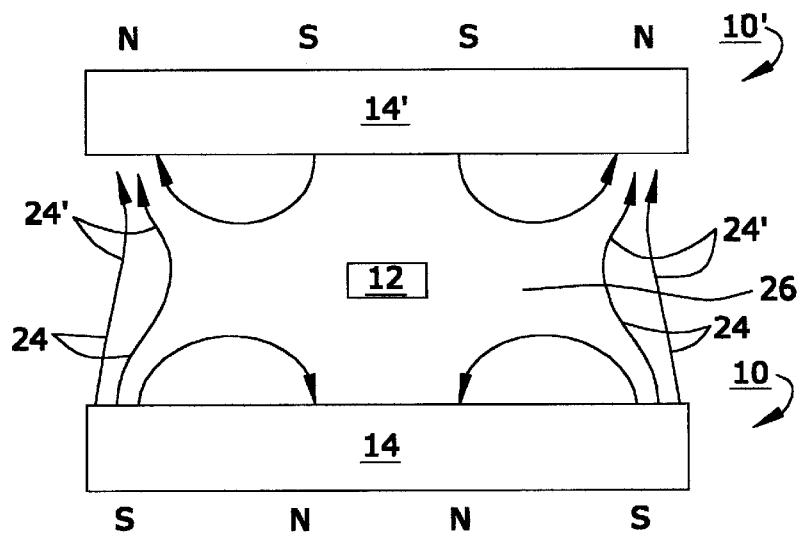
FIG. 3 is a schematic cross-sectional view of a pair of unbalanced magnetrons, each of which is similar to the magnetron shown in FIG. 1, the pair being magnetically coupled through locally non-closed field lines as disclosed in the prior art.

Referring to FIG. 3, a pair of unbalanced magnetrons 10, 10' are shown in substantially opposed orientation on opposite sides of substrate 12 to form a closed sputtering volume. Because the outer poles of magnetrons 10, 10' are of opposite polarity, the "open" magnetic lines 24 of magnetron 10 close with the "open" magnetic lines 24' of magnetron 10' to create a magnetic "cage" which surrounds the plasma. A coating range 26 is thus established among the overlapping plasmas within the cage, whereby opposite sides of the substrate 12 may be coated simultaneously.

Figure 4:
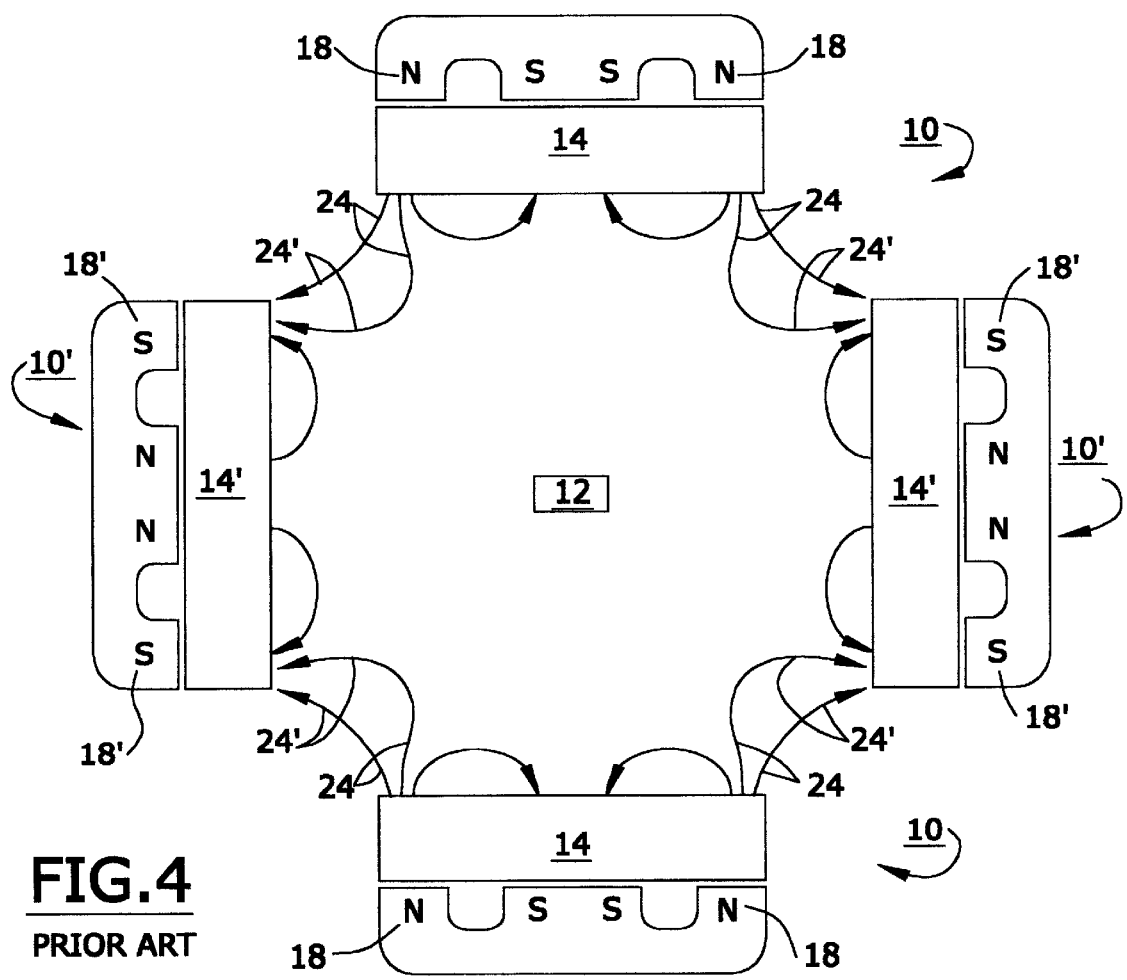
FIG. 4 is a schematic cross-sectional view similar to that shown in FIG. 3, showing magnetic coupling of four such magnetrons as disclosed in the prior art.

Referring to FIG. 4, four unbalanced magnetrons, alternating 10 and 10', are disposed in rectangular relationship, the outer polepieces 18, 18' of each magnetron being opposite in polarity to the outer polepieces of the adjacent magnetron such that "open" magnetic lines 24, 24' are closed between adjacent magnetrons.

As noted above, one limitation of existing UMS designs is that the electrons accelerated away from the target surface along field lines and into the plasma acquire an energy in electron volts approximately equal to the target voltage. This is equal to the voltage across the sheath, one side of which is at target voltage and the other side of which is at plasma voltage (which is substantially at ground). In the prior art unbalanced magnetrons shown in FIGS. 1–4, there is no means to control independently the energy of the accelerated electrons. Typical sputtering voltages are between about 400 V and about 800 V, but unfortunately for prior art magnetrons, the ability of an electron to create an ion in the working gas does not increase linearly with increasing electron energy; rather, maximum ionization efficiency occurs at electron energies between about 50 eV and about 100 eV. Therefore, lower energy electrons are actually more efficient at ionizing the working gas than those produced in prior art UMS devices. In fact, ionizing efficiency of accelerated electrons decreases by about 50% between 100 eV and 500 eV. Further, it would be advantageous to be able to control the number and energy of these electrons and thereby control the density of the associated plasma. Unlike prior art devices, unbalanced magnetron devices in accordance with the present invention have such control.

Figure 5:
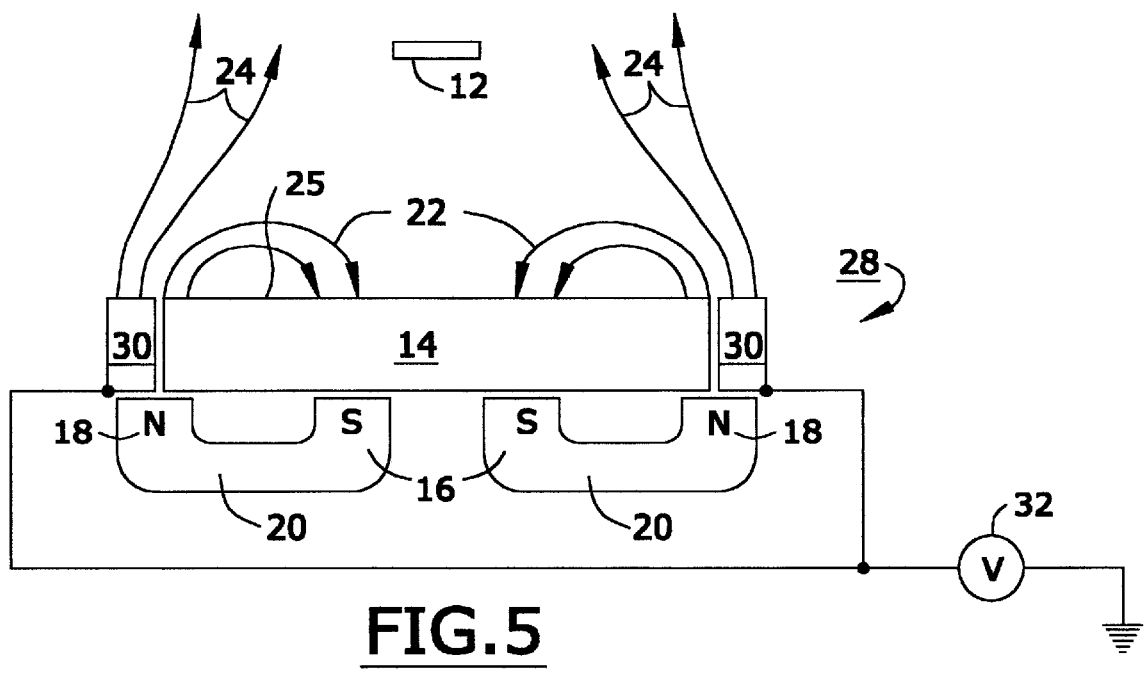
FIG. 5 is a schematic cross-sectional view of a first embodiment of an unbalanced magnetron in accordance with the invention, wherein the outer magnetic polepieces have a greater number of flux lines than the inner polepieces.

Referring to FIG. 5, a novel unbalanced magnetron 28 has a target 14, inner and outer polepieces 16,18, and shunt 20 similar to unbalanced magnetron 10 shown in FIG. 1. However, rather than letting the "open" magnetic field lines 24 emanate from the surface 25 of target 14, an auxiliary or secondary electrode 30, preferably a cathode, is provided outboard of target 14 and over the outer portion of polepiece 18 such that field lines 24 are seen to emanate from the auxiliary electrode 30. Electrode 30 is independent of the primary magnetron cathode noted above and may be independently controlled by conventional control means 32 at a lower field voltage such that auxiliary electrons emitted from electrode 30 and spirally guided into the working gas along field lines 24 have optimal energy for ionization of the working gas, thus increasing the plasma density substantially over densities achievable by known magnetrons under similar operating conditions. Further, the plasma density may be increased very substantially in the vicinity of substrate 12 because the auxiliary electrons are magnetically guided rapidly away from the vicinity of the sputtering plasma and ionization of the working gas can occur throughout the space between closed flux 22 near the target and the substrate.

When electrode 30 is operated at a fixed negative voltage, working gas ions are attracted to the surface of the electrode. If electrode 30 becomes substantially covered with a non-conducting material, these ions will accumulate until the electrode potential is neutralized. Thus, it is preferable to periodically pulse or vary the potential of electrode 30, even to the extent of its being electrically positive intermittently, as is commonly practiced for sputtering insulating cathodes in the known art.

Since electrons are very mobile along magnetic field lines, all points along a field are at approximately the same electrostatic potential. Therefore, if the "open" field lines 24 intersect an insulating substrate, the surface of that substrate reaches an electrical potential similar in magnitude to that of the auxiliary electrode. This provides an indirect means for inherently biasing the surface of the insulator with respect to the plasma, which biasing in prior art magnetrons sputtering apparatus typically requires expensive and complicated radio frequency power.

Figure 6:
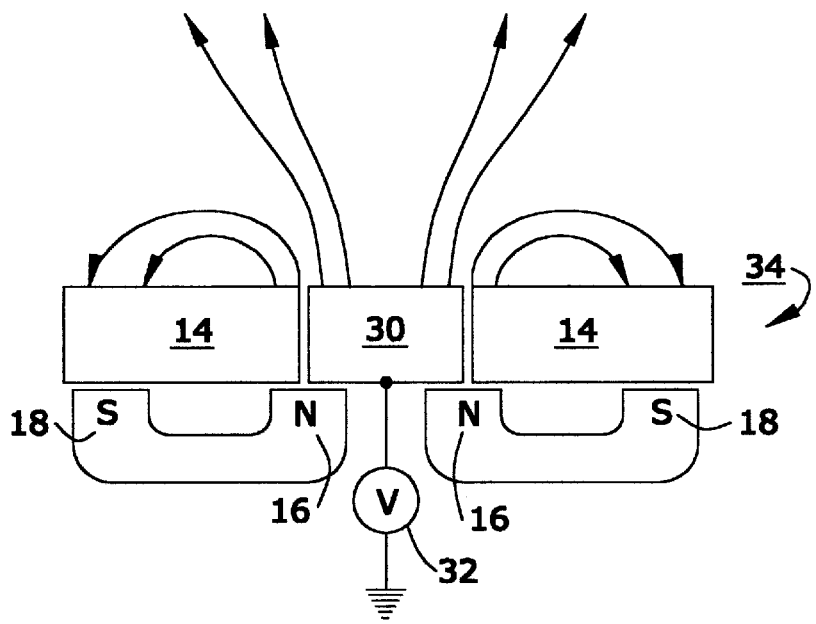
FIG. 6 is a schematic cross-sectional view of a second embodiment of an unbalanced magnetron in accordance with the invention, wherein the inner magnetic polepieces have a greater number of flux lines than the outer polepieces.

FIG. 6 shows another embodiment 34 of an unbalanced magnetron in accordance with the invention, being analogous to prior art magnetron 11, wherein inner polepiece 16 has a greater number of flux lines penetrating than does outer polepiece. Auxiliary electrode 30 is centrally disposed in target 14.

Figure 7:
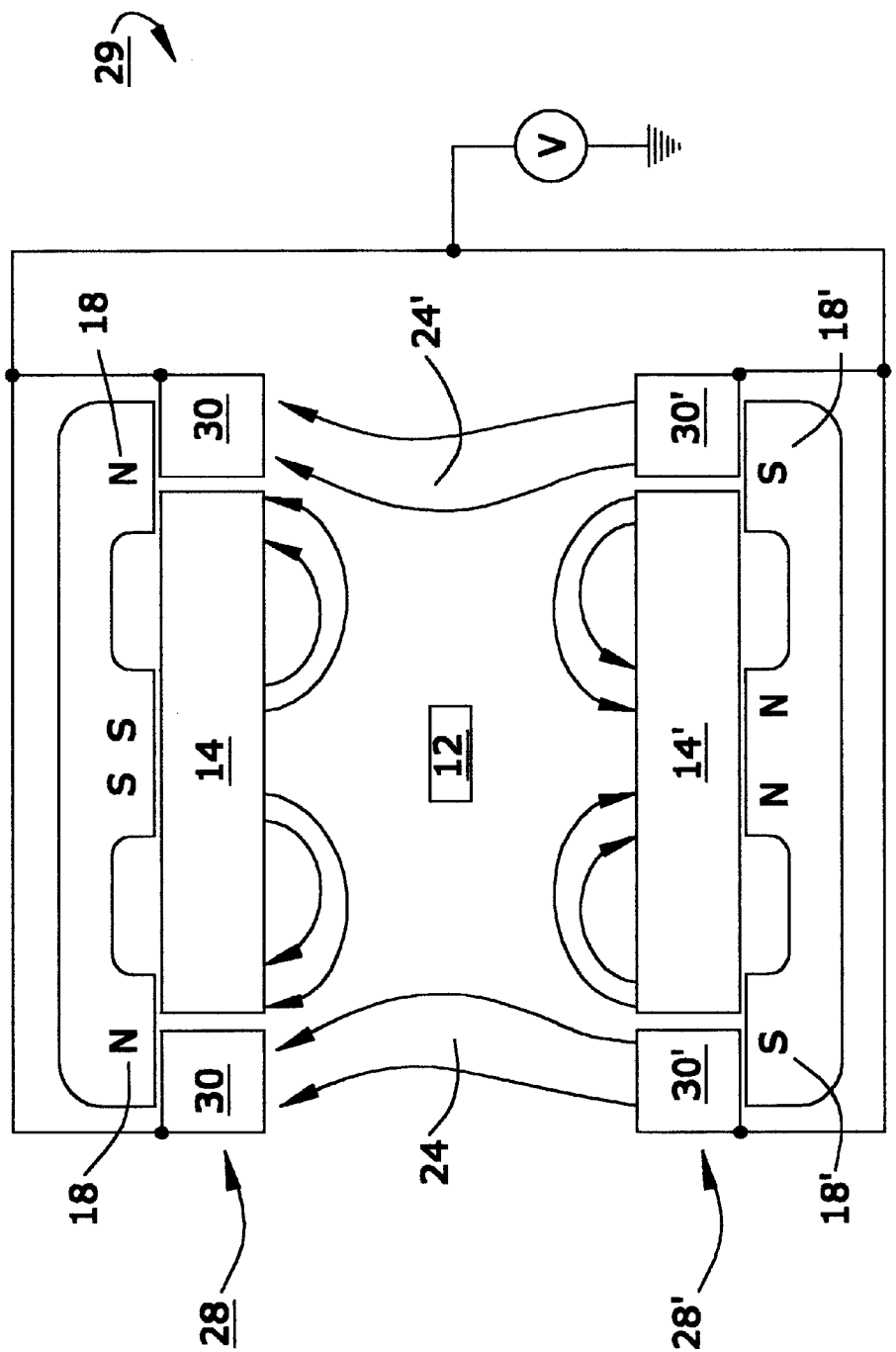
FIG. 7 is a schematic cross-sectional view like that shown in FIG. 3 except employing unbalanced magnetrons in accordance with the invention, like that shown in FIG. 5.
Figure 8:
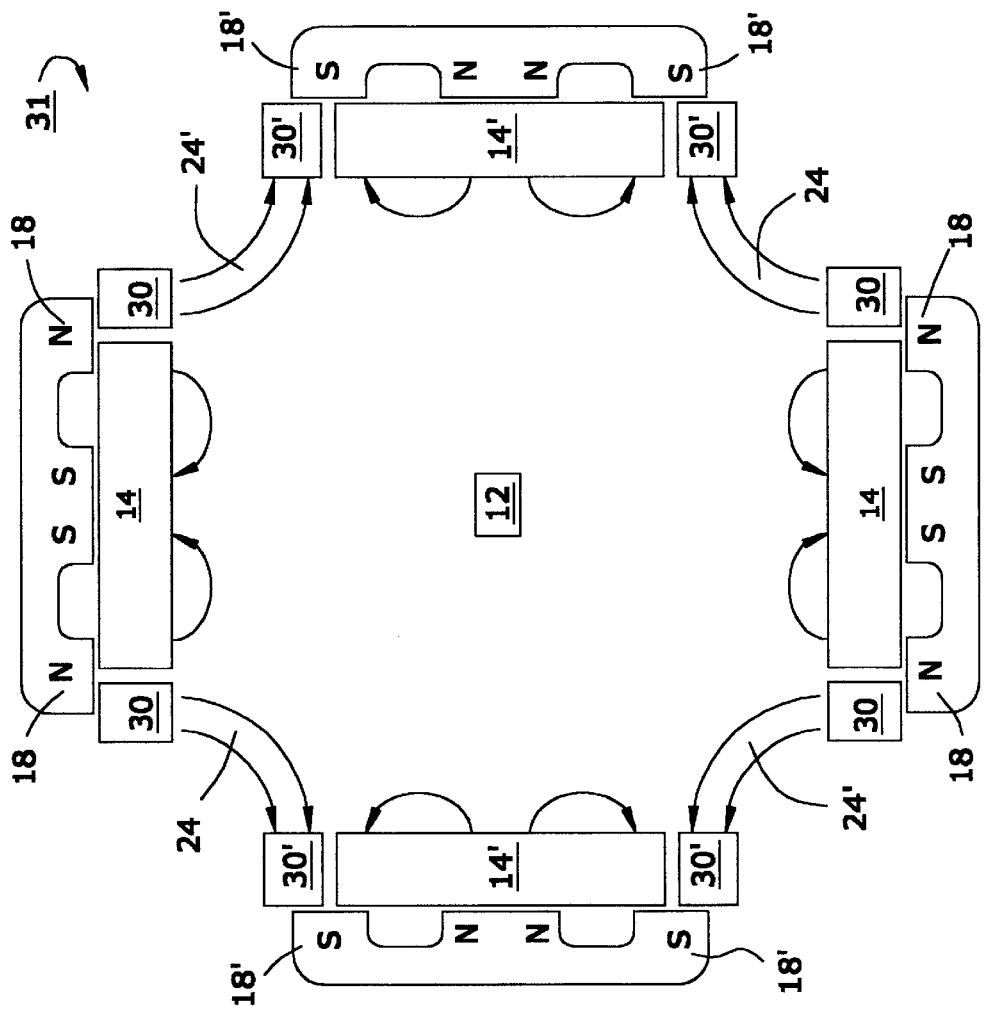
FIG. 8 is a schematic cross-sectional view like that shown in FIG. 4 except employing unbalanced magnetrons in accordance with the invention, like that shown in FIG. 5.

FIGS. 7 and 8 show novel magnetron assemblies 29,31, respectively, analogous to prior art assemblies shown in FIGS. 3 and 4, respectively. Again, the outer poles 18,18' of adjacent magnetrons 28,28', which may be disposed peripherally about substrate 12 for coating various surfaces thereof, have opposite polarity, but the "open" field lines 24,24' emanate from auxiliary electrodes 30,30' to produce an improved plasma trap having a substantially higher plasma density in coating range 26 than can be achieved using prior art unbalanced magnetrons. The auxiliary electrodes of the various magnetrons may be controlled independently, but preferably are maintained at a common potential by a single control means 32.

Figure 9:
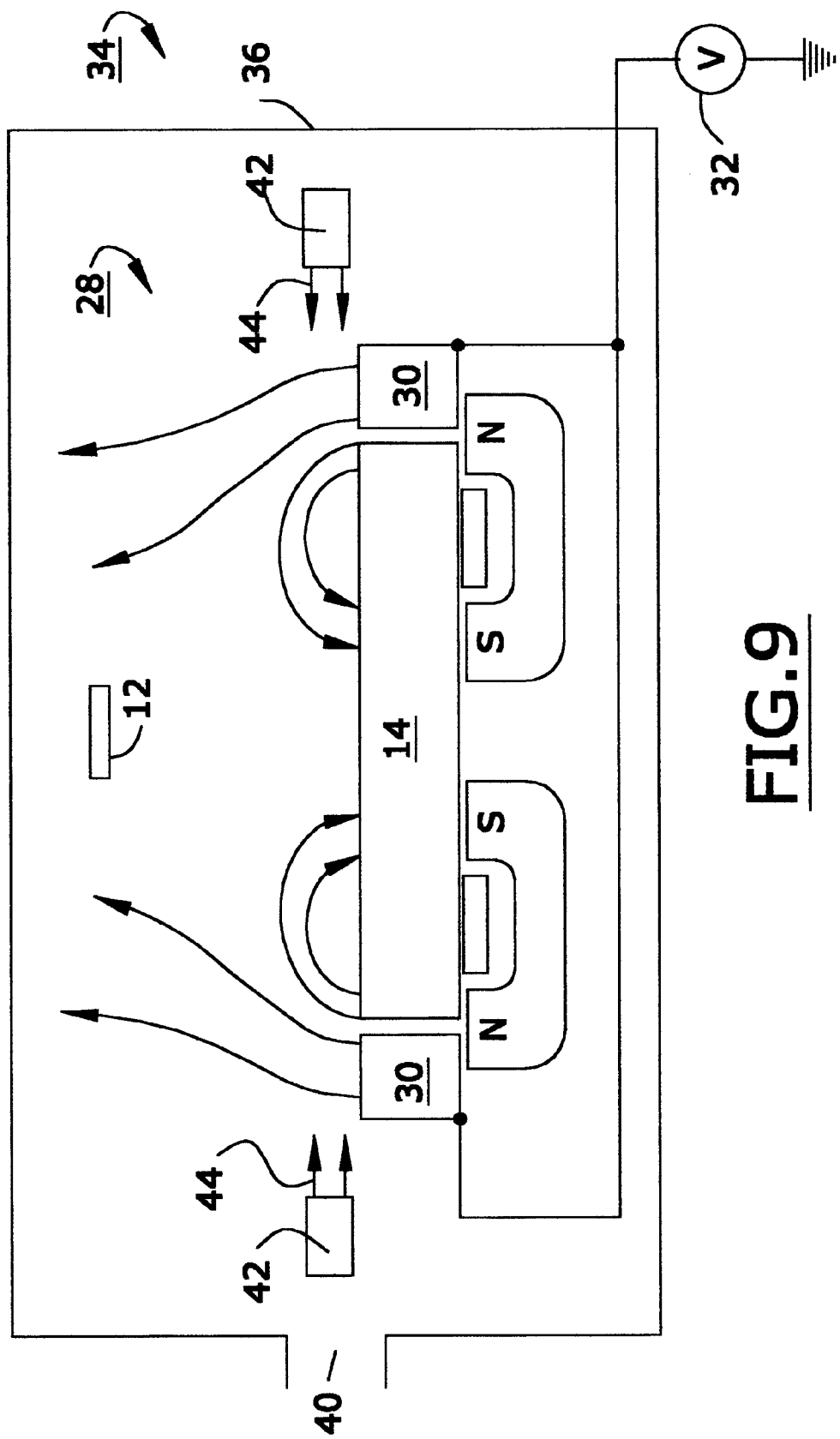
FIG. 9 is a schematic view of an unbalanced magnetron sputtering apparatus incorporating the magnetron shown in FIG. 5.
Figure 10:
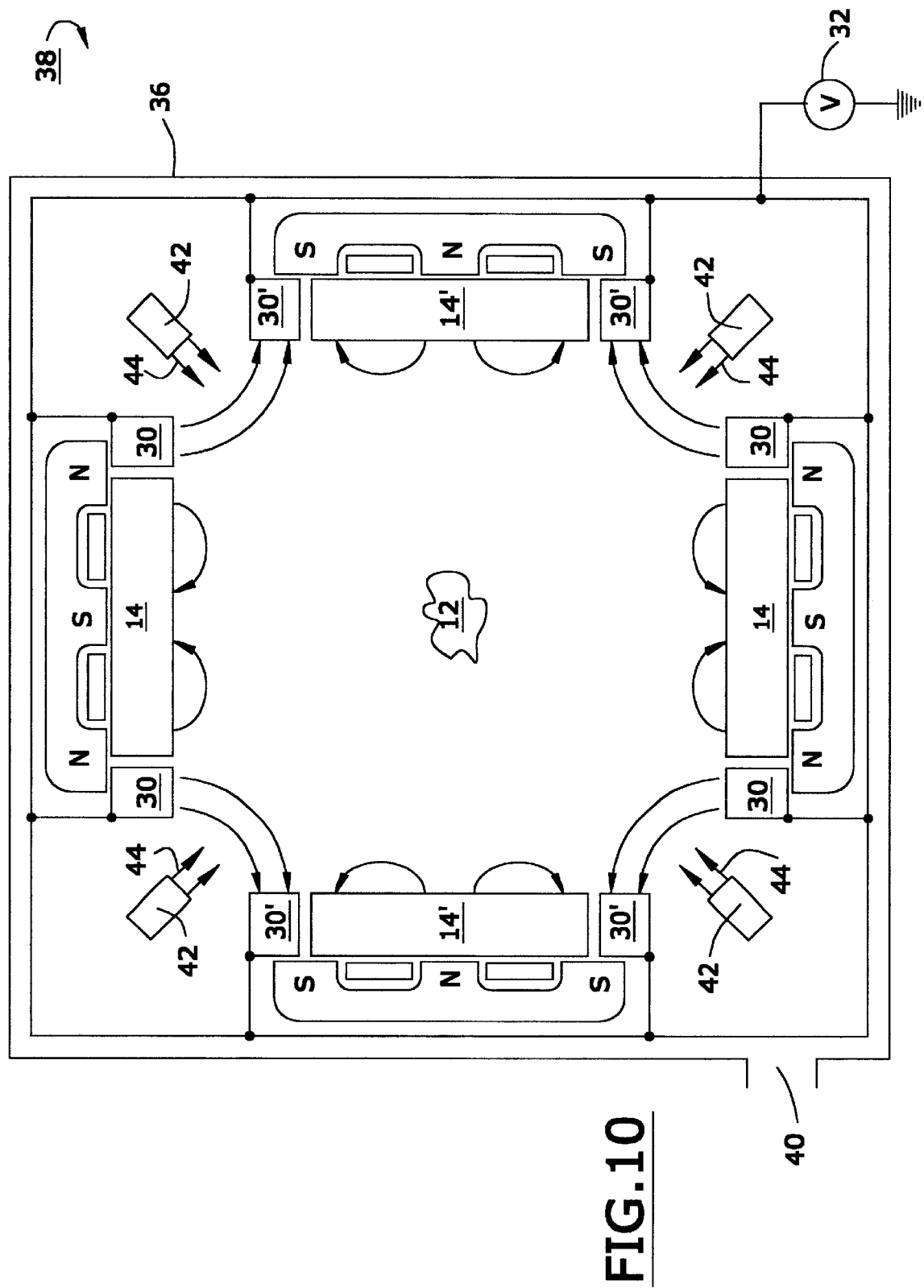
FIG. 10 is a schematic view of an unbalanced magnetron sputtering apparatus incorporating the multiple-magnetron assembly shown in FIG. 8.

Referring to FIG. 9, an assembly 34 for sputter coating a substrate is shown schematically. Unbalanced magnetron 28 is disposed in a housing or chamber 36 which may be operated at a predetermined pressure of one or more working gases, for example argon, by conventional vacuum generating and control means (not shown). Similarly, an alternative sputter coating assembly 38 is shown schematically in FIG. 10 which embodies the unbalanced magnetron assembly 31 shown in FIG. 8. Both assemblies 34 and 38 include a port 40 in housing 36 for exhausting the housing, and supply ducts 42 for supplying the working gas 44 to the coating range 26.

Note that in unbalanced magnetrons in accordance with the invention, the "target" portion defined by the auxiliary electrode surface does not undergo sputtering, for two reasons: first, because the magnetic field lines are substantially orthogonal to the surface, and second, because the electromagnetic sheath in this region cannot accelerate argon ions to energies sufficient to sputter material from the cathode. In fact, material sputtered from the intended target can disadvantageously build up on the auxiliary electrode. Thus, the auxiliary electrode does not have to be of the same material as the target and can be made from any convenient non-ferromagnetic or magnetically transparent material, such as stainless steel or copper.

The control offered by the present invention allows the number and ionization efficiency of the emitted auxiliary electrons to be co-optimized in order to maximize the overall ionization they produce. In the case wherein the invention is used to bias an insulating substrate, the substrate bias energy and the bombardment energy of ions in the plasma may be co-optimized.

From the foregoing description it will be apparent that there has been provided an improved unbalanced magnetron for sputter deposition of target material on a substrate, whereby the number and energy of ionizing electrons near the substrate may be controlled, whereby a plasma may be generated in the vicinity of a substrate to be coated independently of the sputtering plasma, whereby the overall plasma density may be increased, and whereby an insulating substrate by be electrically biased without resort to external biasing means. Variations and modifications of the herein described unbalanced magnetron and multiple magnetron assemblies, in accordance with the invention, will undoubtedly suggest themselves to those skilled in this art. Accordingly, the foregoing description should be taken as illustrative and not in a limiting sense.

What is claimed is:

1. An unbalanced magnetron for sputter deposition of a target material onto a substrate, comprising:
   a) a first polepiece having a first polarity and having a first number of lines of magnetic flux passing therethrough;
   b) a second polepiece having a second polarity opposite to said first polarity and having a second number of lines of magnetic flux passing therethrough, said second number differing from said first number, such that unclosed lines of flux extend from whichever of said first and second polepieces has a higher number of lines of flux passing therethrough;
   c) a target extending along a portion of each of said first and second polepieces between said polepieces and said substrate; and
   d) a non-sputterable auxiliary electrode extending along a portion of said second polepiece adjacent said target such that said unclosed lines of flux pass through said electrode, said electrode being maintained at a biased electrode potential from ground.

2. An unbalanced magnetron in accordance with claim 1 wherein the polepiece having the lesser number of lines of magnetic flux is magnetically saturated.

3. An unbalanced magnetron in accordance with claim 1 further comprising a shunt connecting said first and second polepieces.

4. An unbalanced magnetron in accordance with claim 1 further comprising control means for setting and maintaining said electrode potential at a predetermined voltage.

5. An unbalanced magnetron in accordance with claim 4 wherein said first and second polepieces are substantially closed structures and are mutually concentric.

6. An unbalanced magnetron in accordance with claim 5 wherein said first polepiece is substantially central to said magnetron and said second polepiece is substantially peripheral to said magnetron.

7. An unbalanced magnetron in accordance with claim 5 wherein said first polepiece is substantially peripheral to said magnetron and said second polepiece is substantially central to said magnetron.

8. An assembly for sputter coating of target material onto a substrate, comprising:

a) a housing surrounding said substrate;
b) an unbalanced magnetron disposed within said housing and adjacent said substrate, said magnetron having
   i) a first polepiece having a first polarity and having a first number of lines of magnetic flux passing therethrough, and
   ii) a second polepiece having a second polarity opposite to said first polarity and having a second number of lines of magnetic flux passing therethrough, said second number differing from said first number, such that unclosed lines of flux extend from whichever of said first and second polepieces has a higher number of lines of flux passing therethrough, and
   iii) a target extending along a portion of each of said first and second polepieces between said polepieces and said substrate, and
   iv) a non-sputterable auxiliary electrode extending along a portion of said second polepiece adjacent said target such that said unclosed lines of flux pass through said electrode, said electrode being maintained at a biased electrode potential from ground; and
c) a working gas within said housing between said magnetron and said substrate.

9. An assembly in accordance with claim 8 further comprising a shunt connecting said first and second polepieces.

10. An assembly in accordance with claim 8 further comprising control means for pulse biasing said auxiliary electrode.

11. An assembly in accordance with claim 8 further comprising control means for setting and maintaining said auxiliary electrode potential at a predetermined voltage.

12. An assembly in accordance with claim 11 wherein said predetermined voltage is optimal for ionization of said working gas.

13. An assembly in accordance with claim 8 further comprising a plurality of said unbalanced magnetrons disposed peripherally about said substrate, each of said magnetrons having an inner polepiece and an outer polepiece, said outer polepieces of adjacent magnetrons being of opposite polarity.

14. An assembly in accordance with claim 13 wherein said auxiliary electrodes of said plurality of unbalanced magnetrons are maintained at a common potential.

* * * * *